United States Patent [19]
Monahan

[11] Patent Number: 5,155,359
[45] Date of Patent: Oct. 13, 1992

[54] ATOMIC SCALE CALIBRATION SYSTEM

[75] Inventor: Kevin M. Monahan, Cupertino, Calif.

[73] Assignee: Metrologix, Inc., Santa Clara, Calif.

[21] Appl. No.: 682,097

[22] Filed: Apr. 5, 1991

[51] Int. Cl.⁵ .......................................... H01J 37/28
[52] U.S. Cl. ................................... 250/306; 250/307;
250/310; 250/311
[58] Field of Search ............... 250/306, 307, 309, 310, 250/311

[56] References Cited
U.S. PATENT DOCUMENTS

| | | | |
|---|---|---|---|
| 4,112,295 | 9/1978 | Dubik et al. | 250/237 G |
| 4,442,361 | 4/1984 | Zasio et al. | 250/491.1 |
| 4,766,311 | 8/1988 | Seiler et al. | 250/252.1 |
| 4,885,472 | 12/1989 | Young | 250/491.1 |
| 4,948,971 | 8/1990 | Vogen et al. | 250/310 |
| 4,977,328 | 12/1990 | Van Vucht | 250/491.1 |
| 5,049,745 | 9/1991 | Vogen et al. | 250/310 |

*Primary Examiner*—Jack I. Berman
*Assistant Examiner*—James Beyer
*Attorney, Agent, or Firm*—Burns, Doane, Swecker & Mathis

[57] ABSTRACT

A scanning electron microscope is calibrated using an atomic scale microscope, such as a scanning tunneling microscope or atomic force microscope to permit accurate and precise deflection of the scanning electron beam.

15 Claims, 2 Drawing Sheets

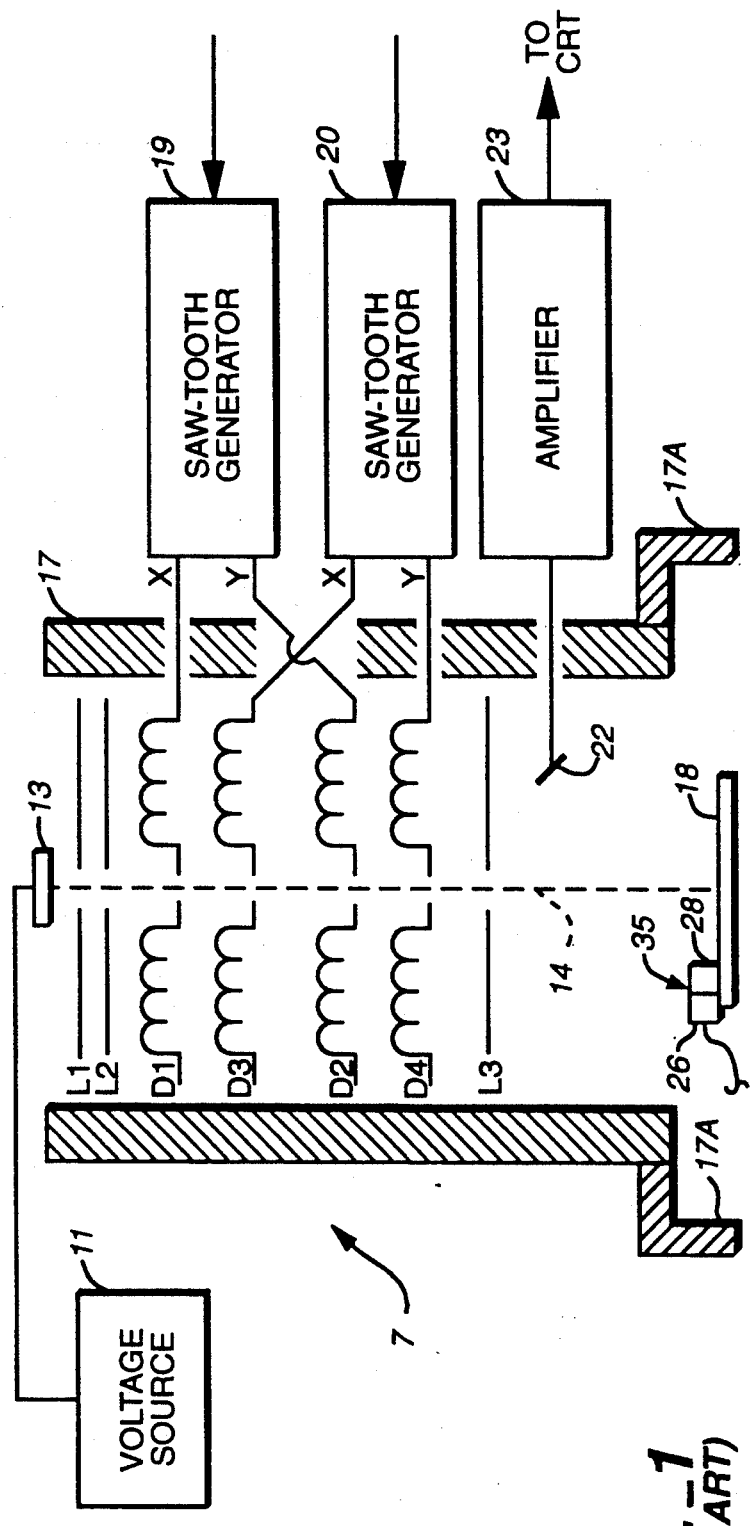
FIG._1
(PRIOR ART)

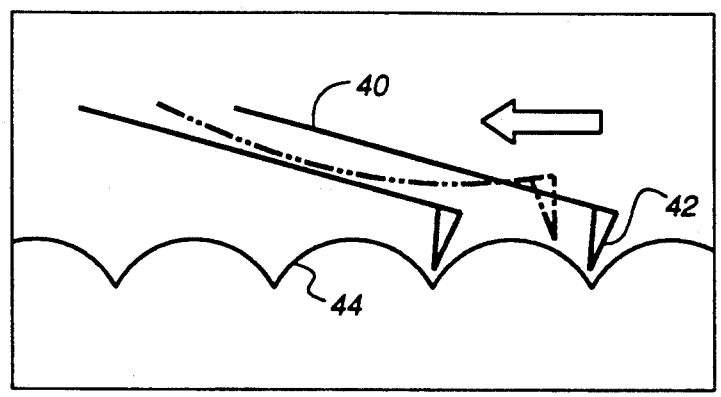
FIG._2
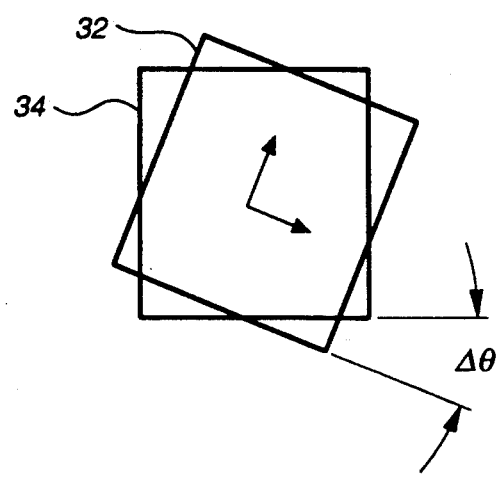
FIG._3
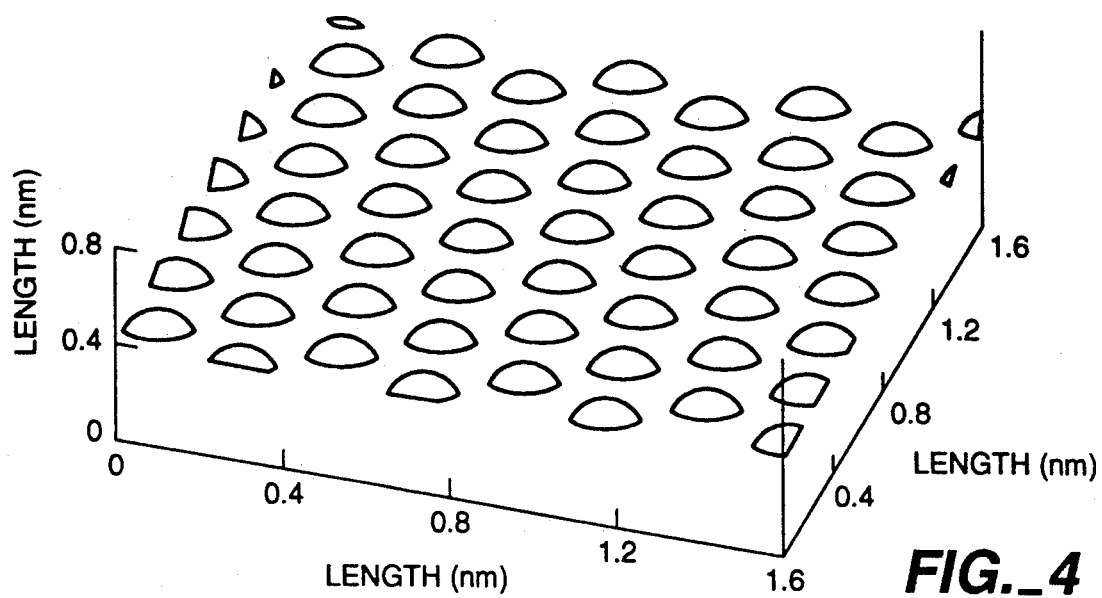
FIG._4

ATOMIC SCALE CALIBRATION SYSTEM

BACKGROUND OF THE INVENTION

1. Field of the Invention

The present invention relates generally to imaging measurement systems. More particularly, the invention relates to precise calibration of electrostatic deflection systems used, for example, in microscopes that employ scanning beams.

Further, the present invention relates to a position controlled wafer stage for improving and maintaining precise calibration of the deflection system.

2. State of the Art

It is known to use electromagnetic systems in microscopes such as scanning electron microscopes (SEMS) for measurement and inspection purposes. Scanning electron microscopes are presently replacing traditional optical microscopes for microelectronics inspection and metrology of applications in semiconductor manufacturing. Metrology tools are, for example, used to measure patterns (e.g., critical dimensions) formed on semiconductor wafers during fabrication.

The short wavelengths of scanning electron microscopes have several advantages over conventionally used optical microscopes. For example, scanning electron microscopes can achieve resolutions from about 100 to 200 Angstroms, while the limiting resolution of optical microscopes is typically about 2,500 Angstroms. Further, scanning electron microscopes provide depths of field several orders of magnitude greater than optical microscopes. Despite the accuracy and precision of present scanning electron microscopes, enhanced instrument specifications and capabilities are required as parameters (e.g., critical dimensions) to be inspected in the submicrometer ranges.

An article entitled "Microelectronics Dimensional Metrology in the Scanning Electron Microscope", Parts I and II, *Solid State Technology* by Michael T. Postek et al. (November 1986), describes a typical SEM wafer inspection instrument. As described therein, a focused electron beam is scanned from point to point on a specimen surface in a rectangular raster pattern. Accelerating voltage, beam current and spot diameter are optimized for the specific application and specimen composition.

As the scanning electron beam contacts the surface of a specimen, backscattered and/or secondary electrons are emitted from the specimen surface. Semiconductor inspection, analysis and metrology is performed by detecting these backscattered and/or secondary electrons. A point by point visual representation of the specimen is obtained on a CRT screen as the electron beam controllably scans the specimen.

Although known scanning electron microscopes are able to provide a resolution adequate for semiconductor manufacturing, several factors limit their resolution. For example, electron beam deflection errors can be introduced into the raster scan of the electron beam.

Wafer positioning stages presently used in the metrology field are movable in two perpendicular axes. These two axes form a plane which is approximately perpendicular to a directed field of view over a wafer surface located on the stage.

A separate glass scale is associated with each of the x and y axes, respectively. Each glass scale enables movement of the wafer stage to be determined with micron resolution. However, this two-axis stage position control produces an inherent ambiguity between rotation and displacement of the stage or wafer surface relative to the stage.

More particularly, rotation of the stage relative to the two scales can affect the detection in the two axes of measurement. Such rotation will thus inhibit accurate imaging of a wafer surface.

Accordingly, it would be desirable to provide a microscope with improved imaging resolution. Such resolution would permit the manufacture of VLSI devices with enhanced precision. Further, it would be desirable to permit accurate calibration despite rotation of the wafer positioning stage.

SUMMARY OF THE INVENTION

Generally speaking, the present enhancing the imaging resolution of relatively fast electrostatic deflection systems used, for example, with scanning electron microscopes More particularly, the present invention relates to systems and methods for calibrating electrostatic deflection using an atomic scale microscope, such as a scanning tunneling microscope or atomic force microscope. Use of the atomic scale microscope in combination with a scanning electron microscope permits accurate and precise deflection of the scanning electron beam.

In a preferred embodiment, a system for imaging a surface is disclosed which includes an electron source, means for generating a charged beam (e.g., an electron beam), means for deflecting said electron beam, and means for calibrating said deflecting means, said calibrating means further including means for counting atomic particles on a reference material surface.

In another preferred embodiment, compensation for misorientation of the reference material surface and/or wafer stage about an axis approximately perpendicular to the wafer surface is provided. This compensation permits the surface plane of a crystalline structure used as the reference material to be oriented perpendicular to the scanning beam so that a more accurate calibration of the beam deflector is possible. By monitoring and compensating stage rotation through an imaging process, accurate calibration can be maintained.

Scanning electron microscopes are fast imaging devices relative to atomic scale microscopes such as STMs and AFMs. However, use of an atomic scale microscope to calibrate a scanning electron microscope provides imaging with a resolution greater than that of the atomic scale microscope, while imaging at a rate equivalent that of the scanning electron microscope.

BRIEF DESCRIPTION OF THE DRAWINGS

The present invention can be further understood with reference to the following description in conjunction with the appended drawings, wherein like elements are provided with the same reference numerals. In the drawings:

FIG. 1 is a general schematic diagram of a system according to the present invention;

FIG. 2 is a partial schematic representation of a piezo-electric driven cantilever in an atomic scale microscope;

FIG. 3 shows position compensation of a piezo-stage support to further improve calibration of a scanning electron microscope; and, FIG. 4 shows a misoriented surface of a reference material.

DETAILED DESCRIPTION OF THE PREFERRED EMBODIMENTS

In FIG. 1, a scanning electron microscope 7 includes a voltage source 11. The voltage source 11 is connected to an electron source 13 that directs a narrow beam of highly accelerated electrons toward a specimen stage 18 via a plurality of electron lenses $L_1$, $L_2$ and $L_3$. In the illustrated embodiment, the electron beam is indicated by the dashed line 14.

In a preferred embodiment, the electron beam is focused onto a wafer stage of the scanning electron microscope using an autofocus technique. For example, a suitable autofocus technique is described in U.S. Pat. No. 4,618,766.

As further shown in FIG. 1, a cylindrical column 17 houses the electron source 13 and the lenses $L_1$, $L_2$ and $L_3$. The column 17 is normally referred to as an electron optical column and includes a chamber, indicated in the drawing as 17A, that surrounds and supports a specimen stage 18. Together, the optical column 17 and the chamber 17A represent the body of the scanning electron microscope.

The scanning electron microscope 7 of FIG. 1 further includes an electrostatic deflection system for selectively scanning the electron beam across specimen stage 18. In the illustrated embodiment, the deflection system includes four pairs of electron beam scanning coils, designated $D_1$ through $D_4$. The scanning coils are located within optical column 17 for focusing the electron beam on the surface of a specimen held on stage 18. In the illustrated embodiment, the pairs of deflection coils $D_1$ and $D_2$ are connected to sawtooth voltage generator 19, and the pairs of deflection coils $D_3$ and $D_4$ are connected to sawtooth voltage generator 20.

The electron beam scanning coils $D_1$ through $D_4$ deflect the electron beam 14 in two, generally perpendicular directions. In the drawing, the deflection directions are designated as the x-direction and y-direction, respectively. The x-direction and y-direction typically are in a plane perpendicular to the direction of beam 14, but strict orthogonality is not required. For present purposes, it can be assumed that coils $D_1$ and $D_3$ deflect the scanning beam in the x-direction and that coils $D_2$ and $D_4$ deflect the scanning beam in the y-direction.

An electron collector 22 is arranged near the surface of stage 18 which is exposed to beam 14. The electron collector is connected to an amplifier 23 which provides signals to a cathode ray tube (CRT) monitor or the like for displaying images of specimens on stage 18 in real time. Alternately, collector 22 can be connected to an analog-to-digital converter for transforming the collected electron current to digital signals which may be subsequently displayed.

In operation, saw-tooth generators 19 and 20 provide time-varying voltage signals to electron beam scanning coils $D_1$–$D_4$ such that beam 14 is deflected across specimen stage 18 in a predetermined scanning pattern. The saw-tooth generators 19 and 20 typically operate synchronously to drive the electron beam across stage 18 in the x-direction at a constant rate, with each scan being deflected in the y-direction to form a series of generally parallel scanning lines.

During operation of the FIG. 1 scanning electron microscope, collector 22 detects changes in the electron current at stage 18. Thus, as the electron beam scans a specimen on stage 18, changes in the composition, texture and topography of the specimen cause amplitude variations of the electron current detected by collector 22. With each complete scanning sequence, an image corresponding to features of the specimen surface can be created.

As will now be explained, accurate deflection of the electron beam can be ensured by providing an atomic scale calibration device 35. The atomic scale calibration device 35 includes, for example, an atomic scale microscope 26 such as a known scanning tunneling microscope (STM) or a known atomic force microscope (AFM). Further, the atomic scale calibration device includes a digital counter 28.

A scanning tunneling microscope is a microscope capable of magnifying materials to atomic levels. An image of a material is determined by passing a very small probe over a surface of the material and detecting changes in an alternating voltage along the surface. The detected changes in alternating voltage are proportional to the shape of the atoms which form the material surface.

Atomic force microscopes are similar to STM's in that they are capable of imaging atomic corrugations of a sample surface. AFM's are, for example, described in an article entitled "Improved atomic force microscope images using microcantilevers with sharp tips", by S. Akamine et al. As described therein, an AFM uses deflection changes of a force sensing cantilever to interrogate a sample surface. Accordingly, because sensed deflection changes rather than voltage changes are used the AFM can image insulators as well as conductors.

The force sensing cantilever, or probe, is typically a microfabricated cantilever. For example, the aforementioned Akamine et al article describes using integrated circuit techniques for fabricating a self-aligned, single crystal silicon tip on a dielectric cantilever.

In a preferred embodiment, the cantilever of a known STM or AFM is piezoelectrically driven along the surface of a specimen placed upon a piezo stage within the STM or AFM sample area. The probe is lowered to within a fraction of a microm from contact with the reference material using a focusing technique such as that described in U.S. Pat. No. 4,071,765.

FIG. 2 shows a piezo-driven cantilever 40 with a single crystal silicon tip 42. The tip 42 is driven across the atoms of a specimen surface 44 located on a piezo stage of the STM or AFM. The specimen surface serves as a reference for calibrating the scanning electron microscope.

The reference material preferably has relatively large lattice spacings. For example, when the calibration device includes a scanning tunneling microscope, preferred reference materials include graphite (lattice spacing of 0.669 nm for 0.001 plane) and silicon (lattice spacing of 0.313 nm for 0.111 plane). When the calibration device includes an atomic force microscope, preferred reference materials include beryllium (lattice spacing of 0.798 nm for 0.010 plane), mica (lattice spacing of 0.996 nm for 0.002 plane) and lead stearate (lattice spacing of 5.1 nm).

In operation, calibration of the scanning electron microscope image field is effected by locating the basic components of an atomic scale microscope (e.g., STM and/or AFM) in, for example, a corner of the SEM wafer stage. Typically, a square or rectangular SEM wafer stage is of sufficient size to easily hold a wafer having an eight inch (i.e., approximately 200 mm) diameter.

The image field of a typical SEM is approximately 4 micrometers in diameter, significantly smaller than that of a wafer surface. Using electrostatic deflection of the electron beam in accordance with a preferred embodiment, the location of the beam can be controlled relative to the wafer stage with 1 nm accuracy. That is, a given location on the wafer stage can be addressed by the electron beam within ±1 nm.

In a preferred embodiment, imaging of the wafer surface is performed by scanning the SEM image field over the wafer surface. However, prior to scanning a wafer surface, a calibration mode is initiated. In the calibration mode, the wafer stage is controlled to move the atomic scale microscope 35 to the center of the SEM image field. The atomic scale microscope is then activated to piezo-electrically drive the cantilever of the atomic scale microscope along the atoms which form a surface of the reference material. As each atom is detected, the counter is incremented. The number of atoms counted can be readily correlated to distance.

More particularly, as the piezo driver cantilever is driven back and forth across the atoms of the reference material (e.g., mica, having approximately 1 micron lattice spacing), the position of the SEM beam is monitored. If, for example, the SEM beam traverses a distance over the mica corresponding to 100 deflections of an atomic scale microscope it can be readily ascertained that the scanning beam has traversed a distance of 100 microns.

At this juncture, it should be appreciated that the atomic scale microscope need not be positioned into the SEM field of view as described above to effect a calibration mode. For example, the SEM field of view can alternately be re-positioned over a portion of the wafer stage which includes the reference material.

In practice, the a priori determination that 100 mica atoms approximately correspond to a distance of 99.6 nm is performed in advance of the calibration using known techniques such as, for example, x-ray crystalography. Accordingly, upon determining a desired deflection of the electron beam in a scanning electron microscope, the number of atoms along the surface of the reference material which correspond to the desired deflection distance can be readily determined.

Using the foregoing systems and methods, extreme accuracy in the calibration of a microscope, such as a SEM, is achieved. Unlike conventional calibration standards, the use of an atomic scale microscope to count atoms along the surface of a secondary reference material provides an absolute calibration standard. Moreover, this standard is based on the fundamental crystalline structure of the reference material.

By using the above-described calibration methods, enhanced accuracy is attained even though placement accuracy of the electrostatically deflected beam is approximately equal to the lattice spacings of the reference material (e.g., beam placement accuracy is about ±1 nm, approximately equal to mica lattice spacing). That is, placement accuracy of an SEM relative to useable atomic lattice structures as described above would logically suggest only limited use of the reference materials in enhancing calibration of the SEM. On the contrary, use of the relatively slow STM or AMF with a the relatively fast SEM in accordance with preferred embodiments has proven to significantly enhance accuracy of the SEM.

By monitoring the atomic count of a reference material in two dimensions (e.g., x and y axes), two dimensional calibration control of the electron beam 14 can be attained. For example, count errors in both x and y deflection directions can be used to adjust the frequency and/or amplitude of the x and y deflection energies output by sawtooth generators 19 and 20.

This two-dimensional calibration not only permits inaccuracies in the electron beam deflection to be detected and compensated, but in addition, permits the entire image field of the scanning electron microscope to be corrected. For example, image field inaccuracies such as distortions in the electron optics (e.g., electron lenses $L_1$, $L_2$ and $L_3$) can be readily compensated.

In another embodiment, the orientation of the wafer stage and the reference material surface in the wafer stage plane is monitored and controlled to improve calibration of the scanning electron microscope. For example, orientation of the piezo-stage is controlled to orient the atoms along axes which are parallel to the direction of the atomic scale microscope's cantilever movement. The failure to correctly orient the reference material surface can lead to cosine errors when using an atomic scale microscope to detect lattice spacing.

As shown in FIG. 3, the piezo stage is, for example, reoriented from a location 32 to a location 34 by rotating the piezo-stage by an angle of theta. Reorientation is further effected in x and y axes of the piezo stage. In a preferred embodiment, three laser holographic scales are used to provide precise determination of x, y and theta values.

Laser holographic scales give placement measurements to within 0.05 microns. More particularly, these devices enable coordinates to be taken directly from a stepper device (i.e., device for exposing patterns on a wafer) and translated into coordinates that enable specific features to be identified on a wafer to within ±0.05 microns. Thus, characteristics of a wafer can be used for the orientation alignment, thereby avoiding lengthy and complex pattern recognition techniques for aligning the wafer stage. This advantage substantially decreases throughput time of a wafer fabrication process.

During calibration, measurements using the laser holographic scales are taken in four corners of the SEM field of view. The wafer stage is then rotated 90° and four calibration measurements are again taken in the field of view corners. Using variations in the measurements obtained for each corner, distortions in the image field can be directly determined. These distortions include, but are not limited to, misorientation of the wafer stage and edge distortions in the focusing lens.

By identifying the portion in a field of view where a distortion is detected, a corresponding portion of the focusing system can be identified. In addition, misorientation of the stage can be corrected and compensated.

The foregoing stage compensation permits the crystalline structure of a reference material to be correctly aligned with respect to the atomic microscope probe. For example, FIG. 4 shows a misoriented lattice structure of a reference material. By monitoring stage rotation throughout all subsequent measurements using the SEM, compensation of the stage orientation can be continuously implemented to maintain the accurate calibration established during the calibration mode.

It will be appreciated that other positioning techniques can be used. For example, use of laser interferometry or three glass scales (one in each of three axes) can also be used to align the piezo stage. When three detectors are used, variables associated with each of three axes defining the wafer stage coordinate system can be deconvolved from the movement detected.

While the foregoing description has discussed preferred embodiments it will be readily apparent to those skilled in the art that beams other than electron beams can be used in the scanning electron microscope. For example, other beams such as ion, photon and X-ray beams can be used.

Further, it will be appreciated that while preferred embodiments have been described which include the use of a scanning electron microscope to perform semiconductor metrology applications, the invention will be useful for any technology where high image resolution and extreme precision are required or desired. For example, the present invention is equally applicable to micromachining, medical image calibration, integrated circuit lithography, overlay analysis on step-and-repeat optical lithography tools, electron beam lithography tools and x-ray lithography tools.

Although the present invention has been described in its preferred embodiments, those skilled in the art will appreciate that alternate embodiments, not specifically described may be selected without departing from the spirit and scope of the invention, which is defined in the appended claims.

What is claimed is:

1. Apparatus for imaging a surface comprising:
   means for generating a sensing beam having a field of view which is scanned over a material to be imaged;
   means for deflecting said sensing beam; and
   means for calibrating said deflecting means, said calibrating means further including means for counting atomic particles on a reference material surface placed within said field of view.

2. Apparatus according to claim 1, wherein said sensing beam is an electron beam.

3. Apparatus according to claim 1, wherein said sensing beam is an proton beam.

4. Apparatus according to claim 1, wherein said sensing beam is an ion beam.

5. Apparatus according to claim 1, wherein said sensing beam is an x-ray beam.

6. Apparatus according to claim 1, wherein said calibrating means is a scanning tunneling microscope.

7. Apparatus according to claim 1, wherein said calibrating means is an atomic force microscope.

8. Apparatus according to claim 6, wherein said calibrating means further includes an atomic force microscope.

9. Apparatus according to claim 1, wherein said material to be imaged is a semiconductor wafer, and said reference material is mica.

10. Apparatus according to claim 1, wherein said material to be imaged is a semiconductor wafer, and said reference material is graphite.

11. Apparatus according to claim 1, wherein said deflecting means electrostatically deflects said sensing beam to scan the material to be imaged.

12. Apparatus according to claim 1, further comprising a movable stage for supporting said material to be imaged and said calibrating means.

13. Apparatus according to claim 1, wherein said calibration means further includes:
    a probe for sensing atomic particles of said reference material; and,
    a focusing means for locating said probe in a vicinity of said reference material without contacting the reference material.

14. Apparatus for imaging a surface comprising:
    means for generating a sensing beam having a field of view which is scanned over a material to be imaged;
    means for deflecting said sensing beam;
    means for calibrating said deflecting means, said calibration means further including means for counting atomic particles on a reference material surface placed within said field of view;
    means for supporting the material to be imaged; and,
    means for calibrating a position of said supporting means, said supporting means calibrating means detecting misalignment of said supporting means in a plane parallel to the field of view.

15. Method for imaging a surface comprising the steps of:
    generating a sensing beam having a field of view which is scanned over a material to be imaged;
    deflecting said sensing beam; and
    calibrating said deflection, said step of calibrating further including counting atomic particles on a reference material surface placed within said field of view.

* * * * *